United States Patent [19]

Landsburg et al.

[11] 4,164,733

[45] Aug. 14, 1979

[54] QUANTIZED FEEDBACK ANALOG TO DIGITAL CONVERTER WITH OFFSET VOLTAGE COMPENSATION

[75] Inventors: George F. Landsburg; Lorimer K. Hill, both of Cupertino, Calif.

[73] Assignee: Siliconix Inc., Santa Clara, Calif.

[21] Appl. No.: 792,351

[22] Filed: Apr. 29, 1977

[51] Int. Cl.² ............................................. H03K 13/02
[52] U.S. Cl. ........................... 340/347 NT; 324/99 D; 340/347 AD; 340/347 M
[58] Field of Search .... 340/347 NT, 347 M, 347 AD, 340/347 CC; 324/99 D, 76 A, 78 N; 364/832

[56] References Cited

U.S. PATENT DOCUMENTS

| | | | |
|---|---|---|---|
| 3,566,265 | 2/1971 | Reid | 340/347 CC |
| 3,654,560 | 4/1972 | Cath et al. | 340/347 NT |
| 3,872,466 | 3/1975 | Wold | 340/347 NT |
| 3,942,174 | 3/1976 | Dorey et al. | 340/347 NT |

PUBLICATIONS

Staff of Teledyne Semiconductors, CMOS Converter With Charge Balancing, New Electronics, vol. 8, No. 24, pp. 30–31, Dec. 9, 1975.

Primary Examiner—Thomas J. Sloyan
Attorney, Agent, or Firm—Flehr, Hohbach, Test, Albritton & Herbert

[57] ABSTRACT

Analog to digital converter of the type in which an analog input signal is integrated and charge is applied to the integrating capacitor in predetermined measured quantities to offset or balance the effect of the input signal. A counter is incremented and decremented in accordance with the balancing charge to provide a count corresponding to the input signal. Means is included for eliminating errors due to offset voltages and imperfections in the virtual ground of the integrator, and the operating level of the integrator during a conversion is set independently of the sources which supply the balancing charge.

4 Claims, 12 Drawing Figures

QUANTIZED FEEDBACK ANALOG TO DIGITAL CONVERTER WITH OFFSET VOLTAGE COMPENSATION

BACKGROUND OF THE INVENTION

This invention pertains generally to analog to digital converters and more particularly to analog to digital converters of the quantized feedback or charge balancing type.

In analog to digital converters of the quantized feedback or charge balancing type, the analog input signal is integrated and charge is applied to the integrating capacitor in predetermined measured quantities to offset or balance the input signal. A counter is incremented and decremented in accordance with the balancing current to provide a count corresponding to the input signal. This type of system has a definite advantage over conventional dual slope systems in that the integrator can have a relatively high voltage slew rate even with small input voltages. The amount of charge to be added or subtracted is determined by monitoring the integrator output, and the high slew rate increases the accuracy of the charge balancing and the output count.

With quantized feedback techniques of the prior art, it has been possible to provide resonable conversion accuracy only with amplifiers having relatively low offset voltages. Heretofore, such amplifiers have been provided by utilizing discrete components or by using separate integrated circuits for the analog and digital portions of the system, and it has not been possible to build a satisfactory quantized feedback converter on a single chip.

SUMMARY AND OBJECTS OF THE INVENTION

The invention provides a charge balancing analog to digital converter which avoids the need for ideal amplifiers and is suitable for fabrication on a single chip. This converter includes means responsive to the output of the comparator for supplying charge to the integrator to maintain the integrator output at the threshold level of the comparator at the outset of a measurement. Upon completion of the measurement, the integrator output is again at the threshold level, and the effect of any offset voltages is cancelled. The balancing charge is provided by first and second reference sources, one of which includes an amplifier which is connected in a feedback loop with the integrator prior to the measurement to charge a storage capacitor to a level determined by the equilibrium condition established in the loop. The storage capacitor is returned to the input or virtual ground of the integrator, which has the dual advantage of making the feedback loop unconditionally stable and reducing errors which might otherwise arise from imperfections in the virtual ground. The threshold level of the comparator is determined independently of the charge on the storage capacitor, which enables the threshold level to be centered in the linear operating range of the integrating amplifier.

It is in general an object of the invention to provide a new and improved analog to digital converter of the quantized feedback or charge balancing type.

Another object of the invention is to provide an analog to digital converter of the above character which is suitable for fabrication in integrated form on a single chip.

Additional objects and features of the invention will be apparent from the following description in which the preferred embodiment is set forth in detail in conjunction with the accompanying drawings.

DESCRIPTION OF THE PREFERRED EMBODIMENT

Figure 1:
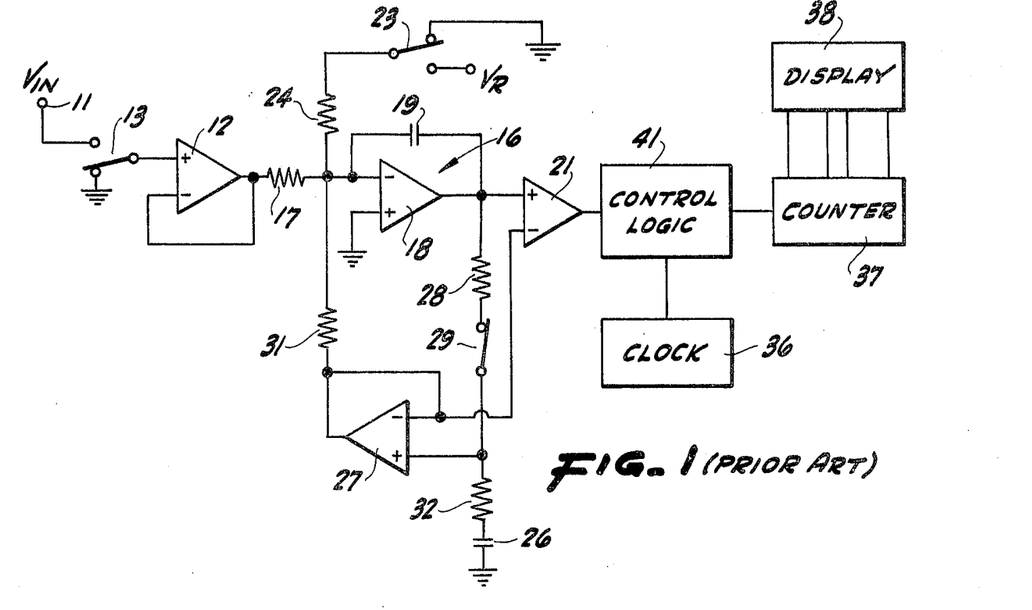
FIG. 1 is a block diagram of a prior art analog to digital converter of the quantized feedback or charge balancing type.

The advantages of the invention can best be understood by first considering a prior art converter of the type which the invention is intended to improve upon. As illustrated in FIG. 1, such a converter includes an input terminal 11 to which an analog input signal $V_{IN}$ is applied. The input terminal is connected to the input of a buffer amplifier 12 through an input switch 13, which provides means for switching the amplifier input between the input terminal and ground. The output of buffer 12 is connected to the summing node or virtual ground 14 of an integrator 16 by a resistor 17. The integrator includes an integrating amplifier 18 and an integrating capacitor 19, and the output of the integrator is connected to the noninverting input of a comparator 21 which determines whether the integrator output signal is above or below a predetermined reference level.

Means is included for supplying charge to the integrator capacitor during a measurement to offset the charge due to the input signal. This means includes a reference voltage source $V_R$ which is connected to the input of the integrator through a switch 23 and a resistor 24. The means for supplying the balancing charge also includes a storage capacitor 26 which is charged with current from the integrator output during an initializing period prior to each measurement. The means by which capacitor 26 is charged includes a buffer amplifier 27 which is connected in a feedback loop with the integrator during the initializing period. In this regard, the integrator output is connected to the noninverting input of the buffer amplifier through a resistor 28 and a switch 29, and the output of the buffer amplifier is connected to the summing node of the integrator through a resistor 31. One side of capacitor 26 is connected to the noninverting input of buffer 27 through a resistor 32, and the other side of the capacitor is connected to circuit ground. The output of buffer 27 is connected to the inverting input of comparator 21, and as described more fully hereinafter, the threshold level of the comparator is approximately equal to the reference voltage established on capacitor 26. During the initializing period, the output of integrator 16 is established at a level which closely approximates the threshold level of the comparator as long as the offset voltages of the comparator amplifier and buffer amplifier 27 are small. The initializing period is commonly referred to as an AUTOZERO period, and amplifier 27 is referred to as the AUTOZERO buffer.

Means is included for counting pulses in accordance with the amount of charge which is supplied from source $V_R$ and capacitor 26 to offset the charge on the integrator capacitor due to the input signal. This means includes a clock 36, a counter 37 and a digital display 38. The counter is a bi-directional BCD counter, and the display includes latches or other suitable means for storing the count to be displayed.

Switches 13, 23 and 29 are electronic switches which are controlled by control logic 41 connected to the output of comparator 21. The control logic also controls the operation of counter 37 and the transfer of counts from the counter to the display.

In one $\pm 3\frac{1}{2}$ digit BCD converter, for example, the operating cycle of the converter is divided into an AUTOZERO period consisting of 2048 clock pulses and a MEASUREMENT period consisting of 4096 pulses. Each of these periods is further divided into a plurality of smaller intervals or octets consisting of eight clock pulses each. During the AUTOZERO period, the input of buffer 12 is grounded, switch 29 is closed to complete the AUTOZERO loop, and switch 23 is operated at a 50% duty cycle in which resistor 24 is alternately connected to voltage source $V_R$ for four successive clock pulses and then connected to ground for four pulses. This produces an equilibrium voltage of $-\frac{1}{2}\cdot(R31/R24)\cdot V_4$ on capacitor 26, where R24 and R31 are the resistances of resistors 24 and 31 and $V_R$ is the voltage of source $V_R$. If R24 and R31 are made equal, then the voltage developed on capacitor 26 is $-\frac{1}{2}V_R$. At the end of the AUTOZERO period, switch 29 is opened, and this voltage is maintained on the capacitor throughout the MEASUREMENT period.

During the MEASUREMENT period, switch 13 connects input terminal 11 to the input of buffer 12, and charge is delivered to the integrator capacitor in accordance with the input signal. The total charge due to the input signal is $Q_S = -(V_{IN}/R17)\cdot 256 \cdot t_{OCT}$, where $Q_S$ is the total charge, $V_{IN}$ is the input signal, R17 is the value of resistor 17, and $t_{OCT}$ is the period of one octet.

During each octet of the MEASUREMENT period, switch 23 is operated at one of two predetermined duty cycles to supply fixed quantities of charge to the integrator capacitor to offset the charge due to input signal $V_{IN}$. In one of these duty cycles, switch 23 is UP (i.e., connected to ground) for the first and DOWN (i.e., connected to $V_R$) for the last seven clock cycles of the octet. This duty cycle is designated duty cycle A in FIG. 2 and is selected when the integrator output is above the reference level at the end of the preceding octet. In the other MEASUREMENT period duty cycle, switch 23 is UP for the first seven cycles and DOWN for the last cycle of each octet. This duty cycle is designated duty cycle B and is selected when the output of the integrator is below the reference level at the end of the preceding octet. For each clock cycle that switch 23 is UP, the charge supplied to the integrator capacitor from source $V_R$ and capacitor 26 is $Q_R = (V_R/R24)\cdot t_{CLK} - [(V_R/2)/R31]\cdot t_{CLK}$, which equals $V_R/2R\cdot t_{CLK}$, where $R24 = R31 = R$ and $t_{CLK}$ is the period of the clock cycle. For each clock cycle that switch 23 is DOWN, the charge supplied by source $V_R$ and capacitor 26 is $Q_R = -(V_R/2R)\cdot t_{CLK}$. Thus for each octet the net charge supplied by source $V_R$ and capacitor 26 is either $+(3V_R/8R)\cdot t_{OCT}$ or $-(3V_R/8R)\cdot t_{OCT}$, depending upon the level of the integrator at the end of the preceding octet.

During the MEASUREMENT period, counter 37 increments in response to each clock pulse when switch 23 is UP and decrements in response to each clock pulse when the switch is DOWN. Thus, the net count goes up six counts for each B duty cycle and down six counts for each A duty cycle. The polarity of the input signal is determined by checking the state of the signal which controls switch 23 when the net count in the counter is zero. The polarity for the last net count of zero in each MEASUREMENT period is stored and used to indicate the polarity of the input signal. As will be apparent from the waveforms of FIGS. 2 and 3, the last zero count coincides with the first occurrence of two consecutive duty cycles of the same type. Two consecutive A duty cycles occur with a negative input, and two consecutive B duty cycles occur with a positive input.

Since the charge balancing and counting are done in increments of $\pm(3V_R/8R)\cdot t_{OCT}$ and $\pm 6$ counts, a short OVERRIDE period is provided following the MEASUREMENT period to return the integrator output to the reference level and complete the count. The OVERRIDE period occurs at the outset of the AUTOZERO period and is completed within the first 32 clock pulses of that period. During the OVERRIDE period, input signal $V_{IN}$ is removed from the integrator, and switch 23 is maintained in an UP state from the outset of the period until the fourth pulse of the first octet in which the integrator output exceeds the reference level. Thereafter, switch 23 is maintained in a DOWN state until the integrator output drops to the reference level, at which point the period terminates. During the OVERRIDE period, the counter continues to increment one count for each pulse when the switch is UP and decrements one count for each pulse when the switch is DOWN. The count in the counter is transferred to the display once per conversion, at the end of the OVERRIDE period.

Figure 2:
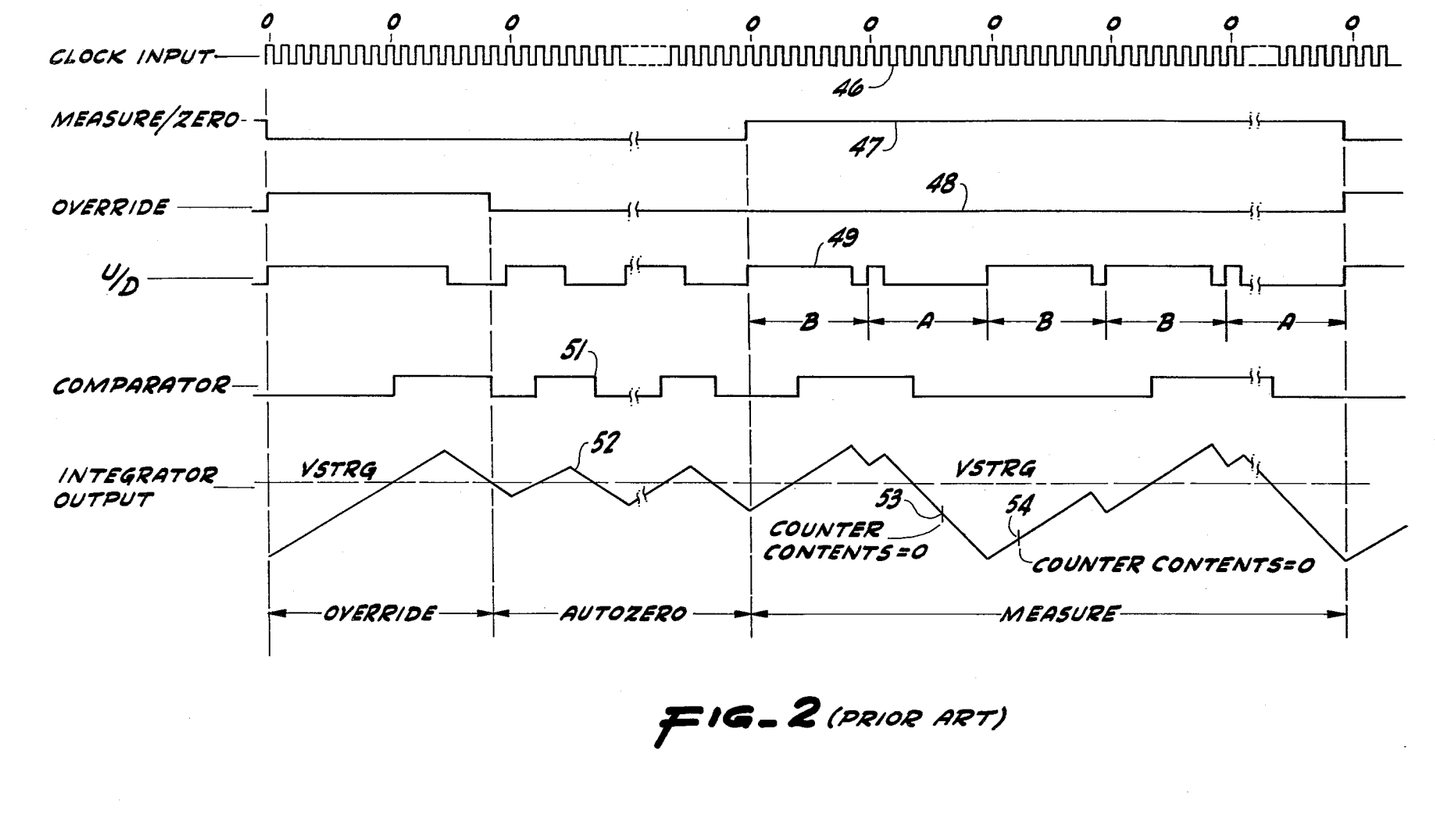
FIGS. 2 and 3 are waveform diagrams illustrating the operation of the converter of FIG. 1.
Figure 3:
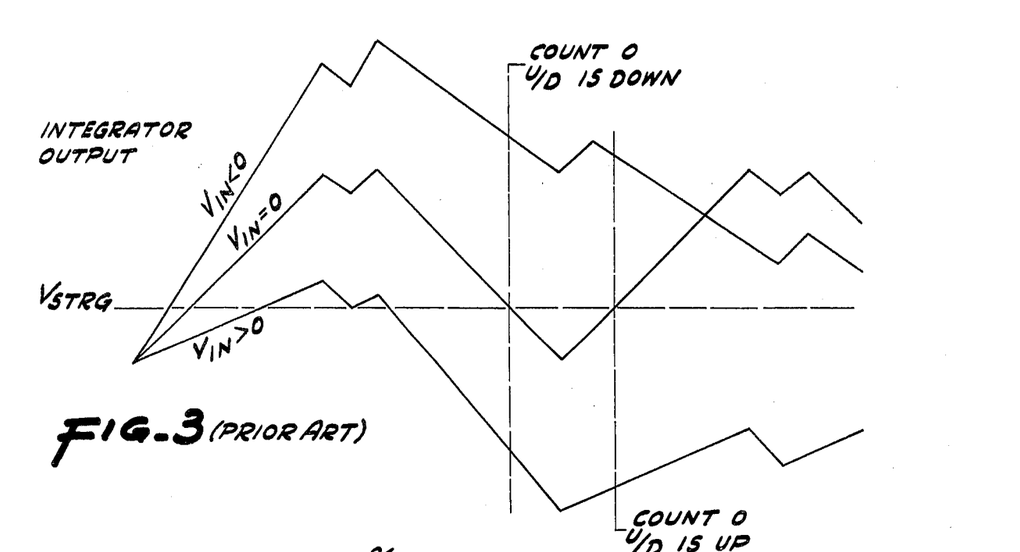

Operation of the converter of FIG. 1 is illustrated by the waveforms of FIGS. 2 and 3. In FIG. 2, the waveforms include a CLOCK signal 46, a MEASURE/ZERO signal 47, an OVERRIDE signal 48, and UP/DOWN control signal 49, the comparator output signal 51, and integrator output signal 52. The MEASURE/ZERO and OVERRIDE signals are generated by control logic 41 and determine the operating cycle of the converter. The UP/DOWN signal is also generated by the control logic and controls the operation of switch 23. In the example given in FIG. 2, the net count is zero at times 53 and 54. SInce time 54 is the last time that the count is zero during the MEASUREMENT period, the state of the UP/DOWN signal at this time indicates the polarity (positive) of the input signal. It will be noted that two consecutive B duty cycles begin at this time, which also indicates a positive input signal. FIG. 3 illustrates the relationship among integrator output signals produced by input signals $V_{IN}$ which are less than, equal to and greater than zero.

With the inverting input of comparator 21 connected to the output of AUTOZERO buffer 27 and storage capacitor 26 returned to circuit ground, integrator 16 operates around a nominal voltage equal to the voltage on the storage capacitor during the AUTOZERO interval and around the comparator threshold during the MEASUREMENT and OVERRIDE intevals. While these are ideally the same operating points, they actually differ by the offset voltages of the buffer amplifier and comparator, as can be seen by summing the voltage sources from the grounded side of capacitor 26 to the inverting input of the comparator:

$$V_T = V_{26} + V_{27} - V_{21},$$

where $V_T$ is the true comparator threshold, $V_{26}$ is the voltage on capacitor 26, $V_{27}$ is the offset voltage of buffer amplifier 27, and $V_{21}$ is the offset voltage of comparator 21. Thus, while the integrator ends the conversion by arriving at the comparator threshold, it begins the conversion at a voltage which differs from the threshold by the combined offset voltages at the AUTOZERO buffer and the comparator. In view of the relatively large incremental change in the integrator output voltage per BCD count, the error created by this difference is small as long as the offset voltage are small. With larger offset voltages, however, the error can be significant, e.g. several BCD counts per conversion.

Figure 4:
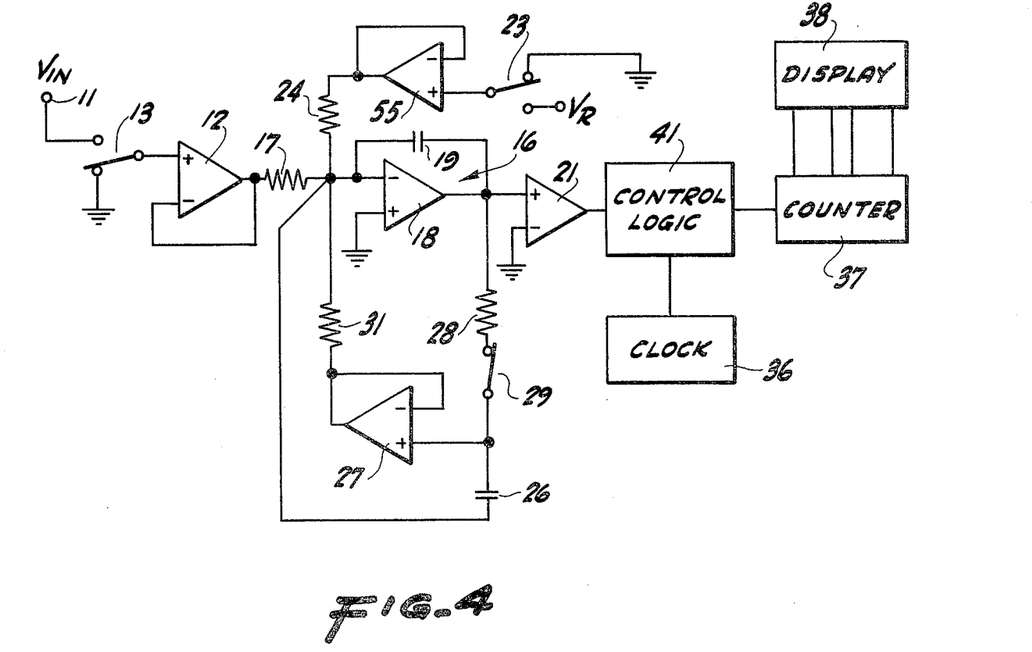
FIG. 4 is a block diagram of one embodiment of an analog to digital converter incorporating the invention.

The embodiment illustrated in FIG. 4 has certain features in common with the converter of FIG. 1, and like reference numerals designate corresponding elements in the two figures. In the FIG. 4 embodiment, a buffer amplifier 55 is inserted between switch 23 and resistor 24, and means is provided for supplying charge to integrator capacitor 19 during the latter portion AZ2 of the AUTOZERO period to establish the output of the integrator at the true threshold level of comparator 21 at the outset of the MEASUREMENT period. This charge occurs during the last four octets of the AUTOZERO period, with switch 29 open and the complement of the comparator output driving switch 23 to form an oscillating loop. If the comparator output is low, the input of reference buffer 55 is grounded and current from capacitor 26 drives the integrator output up. When the comparator switches, so does switch 23, and thereafter the integrator is driven down by current from source $V_R$.

In the embodiment of FIG. 4, the inverting input of comparator 21 is connected to circuit ground, rather than to the output of AUTOZERO buffer 27. This permits a shift in the nominal operating point of the integrator between the first portion AZ1 of the AUTOZERO period and the MEASUREMENT period since the development of the negative reference voltage on capacitor 26 is independent of the actual conversion. This enables the reference voltage applied to the comparator to be arbitrarily set at any desired level, and in the embodiment illustrated, circuit ground is chosen as the threshold level in order to optimize the linear operating capability of the integrator with symmetrical positive and negative supply voltages. The AUTOZERO buffer offset is entirely eliminated as a perturbation of the comparator threshold, and while the integrator operates around the voltage on capacitor 26 during the first portion of the AUTOZERO period, it operates around ground while converting.

Capacitor 26 is connected directly to the non-inverting input of AUTOZERO buffer 27 and is returned to the summation node or virtual ground of integrator 16 instead of circuit ground. This has the dual advantage of making the AUTOZERO loop unconditionally stable and reducing the errors which might otherwise arise from imperfections in the virtual ground. By connecting capacitor 26 to the integrator input, the summation node is effectively bootstrapped via the AUTOZERO buffer, and integrator error current due to nonzero voltages at the summation node is reduced by approximately 50%.

Figure 5:
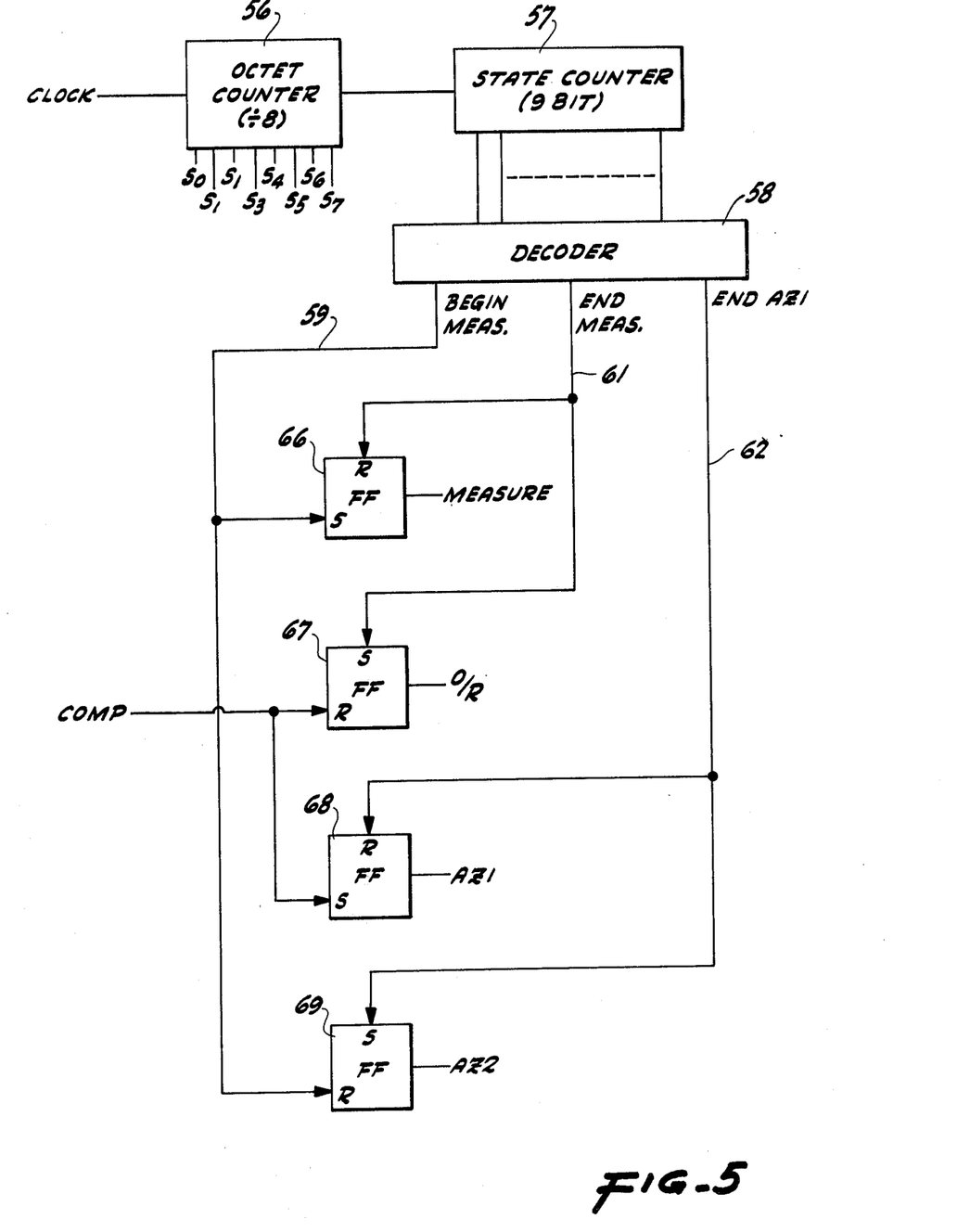
FIGS. 5–11 are block diagrams of the control logic of the embodiment of FIG. 4.

The operating cycle of the embodiment of FIG. 4 is similar to the operating cycle of the converter of FIG. 1 except for the division of the AUTOZERO period into two separate intervals. FIG. 5 illustrates the portion of the control logic which generates the signals which define the different portions of the operating cycle. As illustrated, the clock pulses are applied to the input of an octet counter 56 which delivers one output pulse in response to every eight clock pulses. The output of counter 56 is connected to the input of a state counter 57, and the outputs of this counter are connected to the inputs of a decoder 58. Counter 57 and decoder 58 serve to further count the pulses and deliver signals on lines 59, 61 and 62 to define the beginning of the MEASUREMENT period, the end of the MEASUREMENT period, and the end of the first portion of the AUTOZERO period AZ1. Lines 59 and 61 are connected to the SET and RESET inputs of a flip flop 66, and the output of this flip flop is a MEASURE signal which is high during the 2048 clock pulses of the MEASUREMENT period and low for the 1024 pulses of the OVERRIDE and AUTOZERO intervals of one presently preferred ±3 digit BCD converter.

Line 61 is also connected to the SET input of a flip flop 67, which delivers an output signal O/R which is high during the OVERRIDE interval. This flip flop is reset by the comparator signal when the integrator returns to the threshold level at the end of the OVERRIDE period.

The comparator output is also connected to the SET input of a flip flop 68 which delivers an output signal AZ1 which is high during the first portion of the AUTOZERO period and controls the operation of switch 29. This flip flop is reset by the signal on line 62. Line 62 is also connected to the SET input of a flip flop 69 which delivers an output signal AZ2 which is high during the second portion of the AUTOZERO period. This flip flop is reset by the signal on line 59 at the beginning of the MEASUREMENT period.

Figure 6:
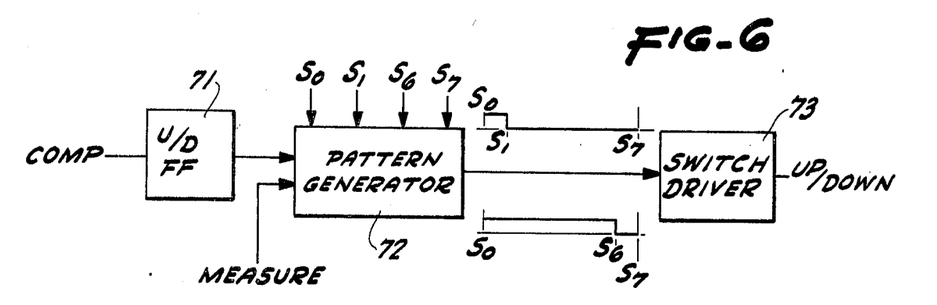

The control logic also includes means for generating the UP/DOWN control signals which control the operation of switch 23 during the different portions of the operating cycle. Given the functions or duty cycles to be generated, this means can be implemented in a number of different ways which will be apparent to those familiar with the art. One embodiment for generating the A and B duty cycles of the MEASUREMENT period is illustrated in FIG. 6. This circuit includes an UP/DOWN flip flop 71 in which the state of the comparator signal at the end of each octet is stored. The output of this flip flop is applied to a pattern generator 72, together with the MEASURE signal from flip flop 66 and the $s_0$, $s_1$, $s_6$ and $s_7$ pulses from octet counter 56. The pattern generator includes combinational logic and a flip flop which respond to the input signals to generate the A and B duty cycle waveforms. The output of the pattern generator is connected to a switch driver 73 which controls the operation of switch 23.

Figure 7:
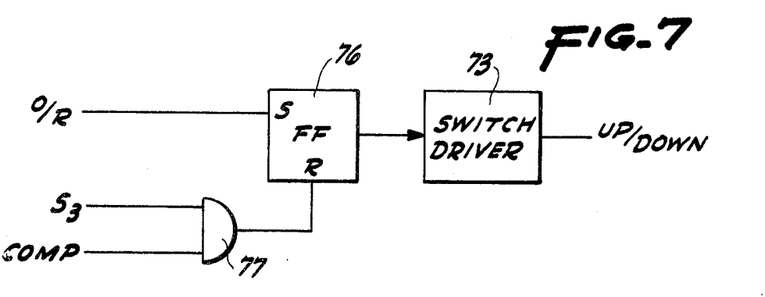

One example of circuitry for generating the UP/DOWN signal which controls the operation of switch 23 during the OVERRIDE interval is illustrated in FIG. 7. The O/R signal from flip flop 67 is applied to the SET input of a flip flop 76, and the output of this flip flop is connected to the input of switch driver 73. Flip flop 76 is reset by the fourth clock pulse of the first octet in which the integrator output is above the threshold level. For this purpose, the $s_3$ output of counter 56 and the output of the comparator are applied to the inputs of an AND gate 77, and the output of the this gate is connected to the RESET input of flip flop 76.

Figure 8:
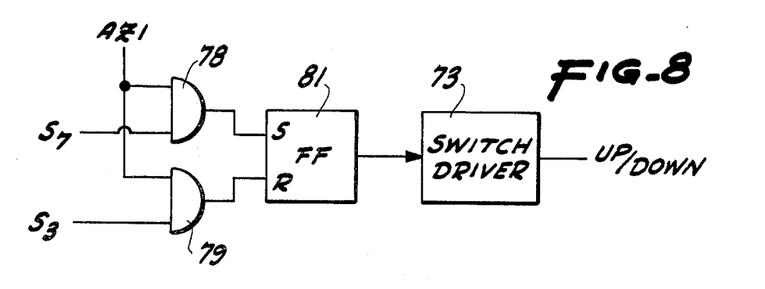

During the first portion of the AUTOZERO period, the UP/DOWN control signal is alternatey UP for four clock pulses and DOWN for four clock pulses. Suitable circuitry for generating this function is illustrated in FIG. 8 and includes AND gates 78, 79 and a flip flop 81. As illustrated, the AZ1 signal is applied to one input of each of the gates, and the outputs of the gates are connected to the SET and RESET inputs of the flip flop. The $s_7$ and $s_3$ signals from octet counter 56 are applied to second inputs of the AND gates, and the output of flip flop 81 is connected to the input of switch driver 73.

Figure 9:
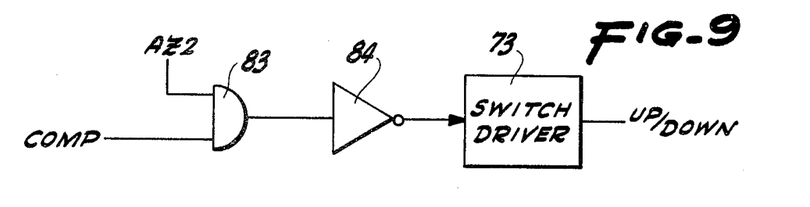

During the second portion of the AUTOZERO interval, the output of the comparator is inverted and utilized to control the operation of switch 23. For this purpose, the comparator output and the AZ2 signal from flip flop 69 are applied to the inputs of a coincidence gate 83, and the output of this gate is connected to the input of an inverter 84. The output of the inverter is connected to the input of switch driver 73.

Figure 10:
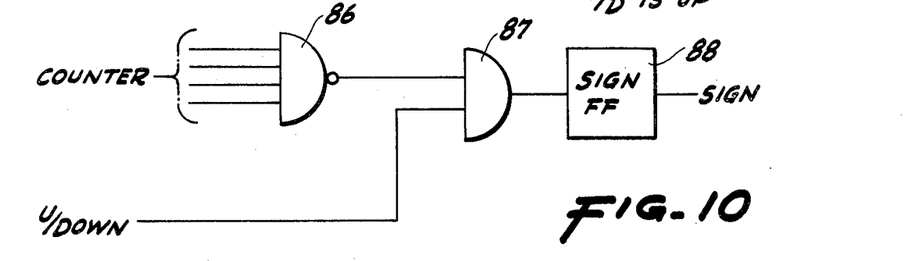

The control logic also includes means for determining the polarity of the input signal controlling the passage of pulses from the clock to the counter. A suitable circuit for determining the input polarity is illustrated in FIG. 10 and includes AND gate 86 which is connected to the outputs of counter 37 to detect the presence of a net count of zero. The output of gate 86 and the UP/DOWN signal from switch driver 73 are applied to the inputs of a coincidence gate 87, and the output of this gate is connected to the input of a SIGN flip flop 88. Each time the net count reaches zero during the MEASUREMENT interval, the state of the UP/DOWN signal is stored in the flip flop and the last state stored during each MEASUREMENT period is utilized as the sign of the input signal.

Figure 11:
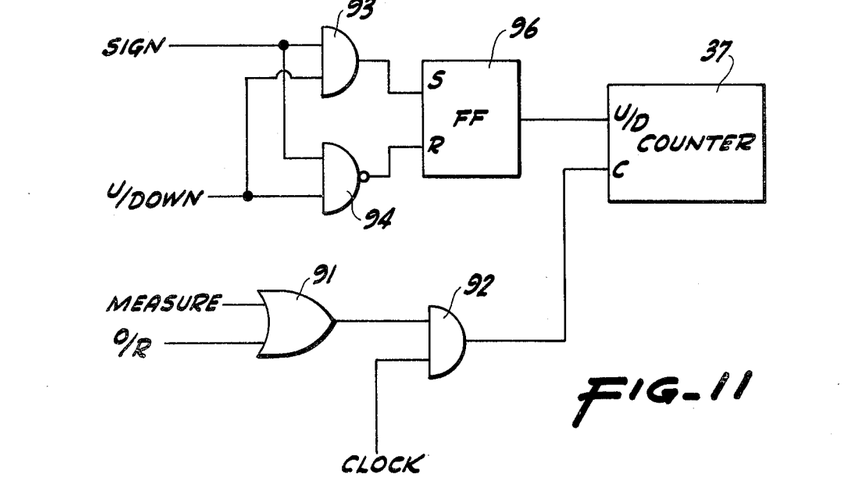

Suitable circuitry for incrementing and decrementing the counter in accordance with the charge required to balance the input signal is illustrated in FIG. 11. This means includes an OR gate 91 which receives the measure and O/R signals as inputs. The output of OR gate 91 is connected to one input of an AND gate 92, and this gate receives a second input from clock 36. The output of gate 92 is connected to the CLOCK input of counter 37, whereby the counter will either increment or decrement in response to each clock pulse during the MEASUREMENT and OVERRIDE periods. The direction in which the counter advances is determined by the polarity of the input signal and the state of the UP/DOWN control signal. The SIGN and UP/DOWN signals are applied to the inputs of an AND gate 93 and a NAND gate 94, and the outputs of these gates are connected to the SET and RESET inputs of a flip flop 96. The output of this flip flop is connected to the UP/DOWN control input of the counter. For positive input signals, the counter increments in response to each clock pulse when the UP/DOWN signal is UP and decrements by each clock pulse when the UP/DOWN signal is DOWN. For negative input signals, the counter decrements when the UP/DOWN signal is UP and increments when the UP/DOWN signal is DOWN. The count is transferred from the counter to the latches in the display in response to the AZ1 signal from flip flop 68, and the SIGN signal from flip flop 88 is utilized to display the polarity of the input signal.

Figure 12:
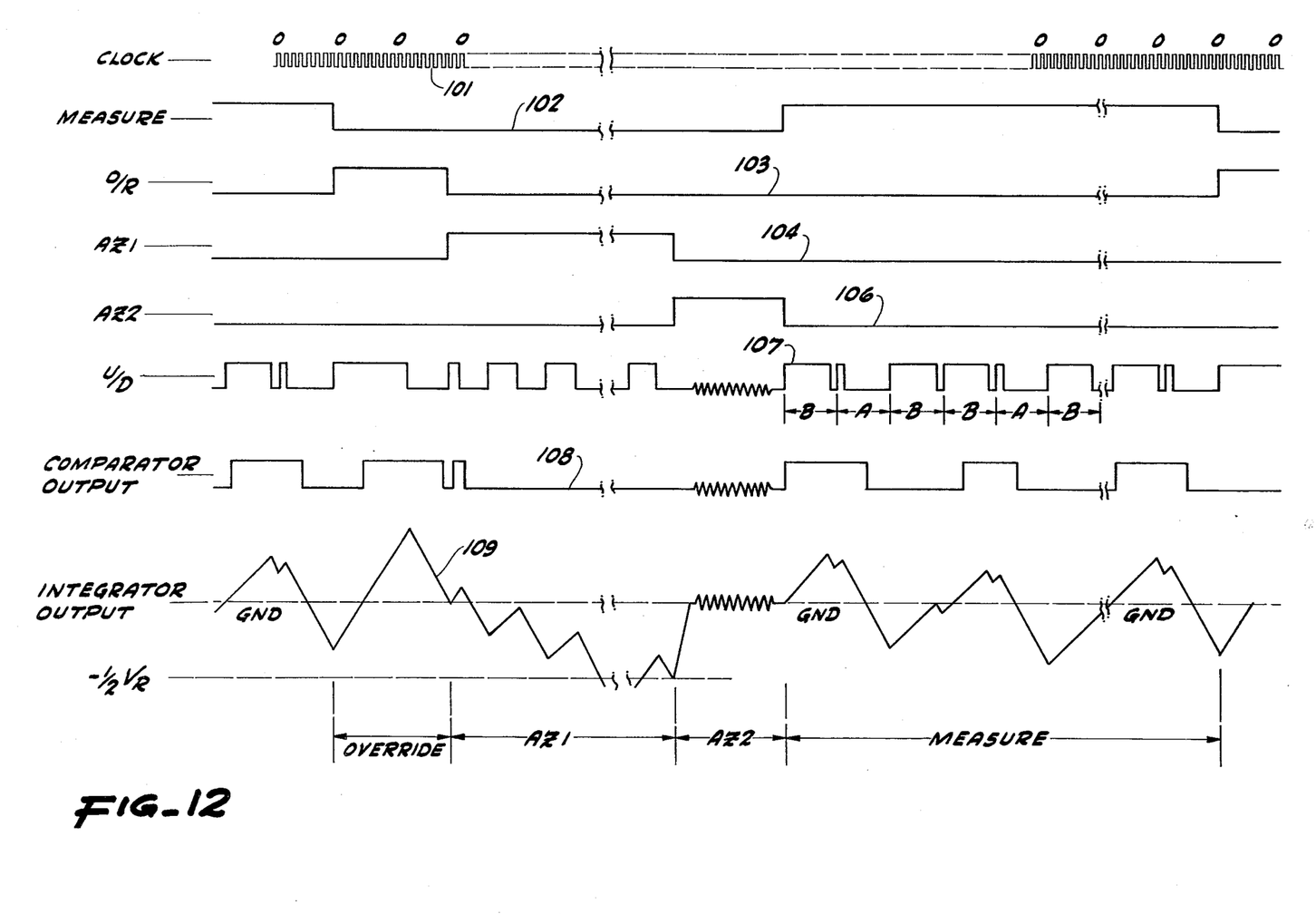
FIG. 12 is a waveform diagram illustrating the operation of the embodiment of FIG. 4.

Operation of the embodiment of FIG. 4 is illustrated by the waveforms of FIG. 12. These waveforms include the CLOCK signal 101, measure signal 102, O/R signal 103, AZ1 signal 104, AZ2 signal 106, U/D signal 107, comparator output signal 108, and integrator output signal 109. From these waveforms, it will be noted that the integrator operates around the reference voltage on capacitor 26 during the first portion of the AUTOZERO interval and around the threshold level of the comparator during the second portion of the AUTOZERO interval and throughout the MEASUREMENT and OVERRIDE intervals.

The invention has a number of important advantages and features. The converter eliminates the problem of offset voltages and substantially reduces errors arising from imperfections in the virtual ground of the integrator. In addition, the threshold level of the converter is set independently of the reference signal, and the integrator can be operated in the center of its linear operating range.

It is apparent from the foregoing that a new and improved analog to digital converter has been provided. While only one presently preferred embodiment has been described, it will be apparent to those familiar with the art that certain changes and modifications can be made without departing from the scope of the invention as defined by the following claims.

What is claimed is:

1. An analog-to-digital converter comprising: an integrator, a storage capacitor, a voltage source, means active during a first initializing period for connecting the capacitor to the output of the integrator and applying a current to the integrator from the source at a predetermined duty cycle to cause the integrator to operate about a predetermined level and establish a voltage corresponding to the predetermined level on the storage capacitor, a comparator having one input connected to the output of the integrator and a second input connected to a reference level intermediate the source voltage and the voltage established on the capacitor, means for applying current from the voltage source and the storage capacitor to the integrator in phase with the comparator output to cause the integrator to operate about the reference level during a second initializing period, means for applying an analog input signal to the integrator during a measurement period, means responsive to the comparator for applying a balancing current to the integrator from the voltage source and the storage capacitor at either a first duty cycle greater than the predetermined duty cycle or a second duty cycle less than the predetermined duty cycle during successive intervals of the measurement period, means active during a period following the measurement period for supplying current to the integrator from the source and capacitor to return the integrator output to the reference level of the comparator, means for providing clock pulses, and means responsive to the comparator for counting the clock pulses during the measurement period and the period following the measurement period to provide a digital output signal.

2. The analog-to-digital converter of claim 1 wherein one side of the storage capacitor is connected directly to the input of the integrator, the other side being connected to the output of the integrator during the first initializing period.

3. An analog-to-digital converter comprising: an integrator including a capacitor, first and second sources for applying charge to the integrator capacitor, said second source comprising a storage capacitor and means active during a first initializing period for connecting the storage capacitor between the output and the input of the integrator and applying current to the integrator from the first source to charge the storage capacitor to a predetermined level, a comparator having one input connected to the output of the integrator and a second input connected to a reference level intermediate the levels of the first and second sources, means active during a second intializing period for applying charge to the integrator capacitor from the first and second sources in accordance with the output of the comparator to cause the integrator to operate about the reference level and thereby establish the output of the integrator at the reference level at the outset of a measurement period following the initializing period, means for applying an analog input signal to the input of the integrator during the measurement period, means responsive to the comparator for applying charge from the first and second sources to the integrator capacitor in predetermined quantities in opposition to the input signal during the measurement period, means active during successive intervals of a period following the measurement period for applying charge to the integrator capacitor from the sources to return the output of the integrator to the reference level, means for providing clock pulses, and means responsive to the comparator for counting the clock pulses during the measurement period and the period following the measurement period to provide a digital output signal.

4. In an analog-to-digital converter: a source of clock pulses, means defining first and second initializing periods and a measurement period each comprising a plurality of intervals corresponding to a predetermined number of clock pulses, an integrator, a reference source, a storage capacitor, means active during the first initializing period for connecting the storage capacitor to the output of the integrator and applying current from the reference source to the integrator for a predetermined duty cycle corresponding to a predetermined number of clock pulses during each interval of said period to establish an equilibrium condition in the integrator and a predetermined charge on the storage capacitor, a comparator having a first input connected to the output of the integrator and a second input connected to a reference level, means active during the second initializing period for applying current from the source and storage capacitor to the integrator in phase with the output of the comparator to establish the output of the integrator at the reference level at the outset of the measurement period, means for applying an analog input signal to the integrator during the measurement period, means responsive to the output of the comparator during the measurement period for selectively applying current from the source and capacitor to the integrator during each interval of the period for either a first duty cycle greater than the predetermined duty cycle or a second duty cycle less than the predetermined duty cycle, said first and second duty cycles being fixed independently of the input signal and corresponding to first and second predetermined numbers of the clock pulses in each interval, bidirectional counting means responsive to the clock pulses and to the level responsive means for advancing a fixed amount in one direction during each interval in which the first duty cycle is selected and advancing a fixed amount in the opposite direction during each interval in which the second duty cycle is selected, means active upon completion of the measurement period for continuing to apply current from the reference source to the integrator and advancing the counting means in response to the clock pulses until the integrator output reaches the reference level, and means responsive to the count in the counting means when the integrator output reaches the reference level for providing an output signal indicative of the input signal.

* * * * *